(12) United States Patent
Yu et al.

(10) Patent No.: US 10,615,253 B2
(45) Date of Patent: Apr. 7, 2020

(54) SEMICONDUCTOR DEVICE HAVING SEPARATION STRUCTURE

(71) Applicants: Semiconductor Manufacturing International (Shanghai) Corporation, Shanghai (CN); Semiconductor Manufacturing International (Beijing) Corporation, Beijing (CN)

(72) Inventors: Guo Bin Yu, Shanghai (CN); Xiao Ping Xu, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 15/974,353

(22) Filed: May 8, 2018

(65) Prior Publication Data

US 2018/0323257 A1    Nov. 8, 2018

(30) Foreign Application Priority Data

May 8, 2017    (CN) .......................... 2017 1 0315276

(51) Int. Cl.
*H01L 29/06* (2006.01)
*H01L 27/092* (2006.01)
(Continued)

(52) U.S. Cl.
CPC .... *H01L 29/0649* (2013.01); *H01L 21/31144* (2013.01); *H01L 21/76224* (2013.01); *H01L 21/823878* (2013.01); *H01L 27/092* (2013.01)

(58) Field of Classification Search
CPC .............. H01L 29/0649; H01L 27/092; H01L 21/31144; H01L 21/76224;
(Continued)

(56) References Cited

U.S. PATENT DOCUMENTS

| 2008/0020542 A1* | 1/2008 | Maynollo | ......... H01L 21/76224 |
| | | | 438/424 |
| 2011/0101488 A1* | 5/2011 | Kim | .................. H01L 21/76229 |
| | | | 257/506 |

(Continued)

OTHER PUBLICATIONS

Liao et al., "Additional Nitrogen Ion-Implantation Treatment in STI to Relax the Intrinsic Compressive Stress for n-MOSFETs," IEEE Transactions on Electron Devices, vol. 59, No. 8, Aug. 2012, pp. 2033-2036.

(Continued)

*Primary Examiner* — Alexander O Williams
(74) *Attorney, Agent, or Firm* — Innovation Counsel LLP

(57) ABSTRACT

A semiconductor device and its manufacturing method, relating to semiconductor techniques, are presented. The semiconductor device includes a substrate, comprising an NMOS region that has a first groove; and a first separation structure, comprising: a first liner layer on the bottom of the first groove and a side surface of a lower portion of the first groove, a first separation material layer on the first liner layer filling the lower portion of the first groove, a second liner layer on a side surface of an upper portion of the first groove, and a second separation material layer on the first separation material layer and the second liner layer filling the upper portion of the first groove. This inventive concepts improves the performance of an NMOS device.

9 Claims, 5 Drawing Sheets

(51) Int. Cl.
*H01L 21/311* (2006.01)
*H01L 21/762* (2006.01)
*H01L 21/8238* (2006.01)

(58) Field of Classification Search
CPC . H01L 21/823878; H01L 29/06; H01L 29/21; H01L 29/311; H01L 21/762; H01L 21/311
USPC ......................................................... 257/510
See application file for complete search history.

(56) References Cited

U.S. PATENT DOCUMENTS

| 2012/0267759 | A1* | 10/2012 | Shroff ................. | H01L 27/0629 257/532 |
| 2013/0256845 | A1* | 10/2013 | Yin ..................... | H01L 29/7833 257/634 |
| 2014/0191358 | A1* | 7/2014 | Liou ................. | H01L 21/76235 257/506 |
| 2015/0054086 | A1* | 2/2015 | Saino ................. | H01L 29/0649 257/369 |
| 2015/0295033 | A1* | 10/2015 | Yoshida ............ | H01L 21/82384 257/402 |

OTHER PUBLICATIONS

He et al., "A Novel Shallow Trench Isolation Liner Dielectric to Enhance NMOS Performance toward 45nm and Beyond," ECS Transactions, 44(1), 2012, pp. 657-663.

* cited by examiner

SEMICONDUCTOR DEVICE HAVING SEPARATION STRUCTURE

CROSS-REFERENCE TO RELATED APPLICATION

This application claims priority to and benefit of Chinese Patent Application No. 201710315276.2 filed on May 8, 2017, which is incorporated herein by reference in its entirety.

BACKGROUND (a) Field of the Invention

This inventive concept relates generally to semiconductor techniques, and more specifically, to a semiconductor device and its manufacturing method.

(b) Description of the Related Art

In a semiconductor manufacturing process, different devices, such as a P-type Metal Oxide Semiconductor (PMOS) device and an N-type Metal Oxide Semiconductor (NMOS) device or different NMOS devices, are separated by a separation structure.

In conventional manufacturing processes, a separation structure is formed by first forming a groove, then forming a liner layer comprising silicon-based oxide on the bottom and a side surface of the groove, and followed by filling the groove with a separation material.

Silicon-based oxide in the liner layer has a large compressive stress that may be introduced into a channel of an NMOS device and impede the migration of charge carriers, which deteriorates the performance of a device.

SUMMARY

Base on the investigation to the issues in conventional methods, this inventive concept proposes an innovative solution that remedies at least some issues of the conventional methods.

This inventive concept first presents a semiconductor device, comprising:
a substrate, comprising an N-type Metal Oxide Semiconductor (NMOS) region that has a first groove; and
a first separation structure, comprising:
a first liner layer on the bottom of the first groove and a side surface of a lower portion of the first groove;
a first separation material layer on the first liner layer filling the lower portion of the first groove;
a second liner layer on a side surface of an upper portion of the first groove; and
a second separation material layer on the first separation material layer and the second liner layer filling the upper portion of the first groove.

Additionally, in the aforementioned device, the second liner layer may comprise $SiO_xN_y$, and x and y are positive integers (e.g., SiON).

Additionally, in the aforementioned device, the first liner layer may comprise silicon-based oxide, and the thickness of the second liner layer may be in a range of 10 angstrom to 100 angstrom.

Additionally, in the aforementioned device, the substrate may further comprise a P-type Metal Oxide Semiconductor (PMOS) region that has a second groove, and the aforementioned semiconductor device may further comprise:

a second separation structure, comprising:
the first liner layer on the bottom and a side surface of the second groove; and
the first separation material layer on the first liner layer filling the second groove.

Additionally, the aforementioned device may further comprise a first hard mask layer on the NMOS region outside the first groove.

Additionally, in the aforementioned device, upper surfaces of the second separation material layer and the first hard mask layer may be substantially at the same horizontal level.

This inventive concept further presents a semiconductor manufacturing method, comprising:
providing a substrate structure, comprising:
a substrate comprising an NMOS region that has a first groove; and
a first hard mask layer on the NMOS region outside the first groove;
forming a first liner layer on the bottom and a side surface of the first groove;
forming a first separation material layer filling the first groove and covering the first hard mask layer;
conducting an etch-back process to remove a portion of the first separation material layer and a portion of the first liner layer to expose an upper portion of the first groove;
forming a second liner layer comprising nitrite-based oxide on a side surface of the upper portion of the first groove; and
forming a second separation material layer filling the upper portion of the first groove.

Additionally, in the aforementioned method, the second liner layer may comprise $SiO_xN_y$, and x and y are positive integers (e.g., SiON).

Additionally, in the aforementioned method, the first liner layer may comprise silicon-based oxide, a source gas for forming the second liner layer may comprise NO, $N_2O$ or $NH_3$, and nitrogen concentration in the source gas for forming the second liner layer may be in a range of $1 \times 10^{14}$ to $1 \times 10^{16}$ atoms/cm$^3$.

Additionally, in the aforementioned method, the thickness of the second liner layer may be in a range of 10 angstrom to 100 angstrom, and the thickness of the portion of the first separation material layer removed in the etch-back process may be in a range of 10 angstrom to 2000 angstrom.

Additionally, in the aforementioned method, a process to form a second liner layer may comprise one of a rapid annealing process, a rapid thermal oxidation and a rapid thermal nitriding process, an atomic layer deposition process, or a chemical vapor deposition process.

Additionally, in the aforementioned method, upper surfaces of the second separation material layer and the first hard mask layer may be substantially at the same horizontal level.

Additionally, in the aforementioned method, the substrate may further comprise a PMOS region that has a second groove, the substrate structure may further comprise a second hard mask layer on the PMOS region outside the second groove, the first liner layer may further cover the bottom and a side surface of the second groove, the first separation material layer may further fill the second groove and cover the second hard mask layer,
and the etch-back process may comprise:
forming an auxiliary hard mask layer on the PMOS region;
removing a portion of the first separation material layer and a portion of the first liner layer on the NMOS region using the auxiliary hard mask layer as a mask to expose the upper portion of the first groove; and removing the auxiliary hard mask layer.

Additionally, the aforementioned method may further comprise:

removing the first hard mask layer and a second hard mask layer.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1:
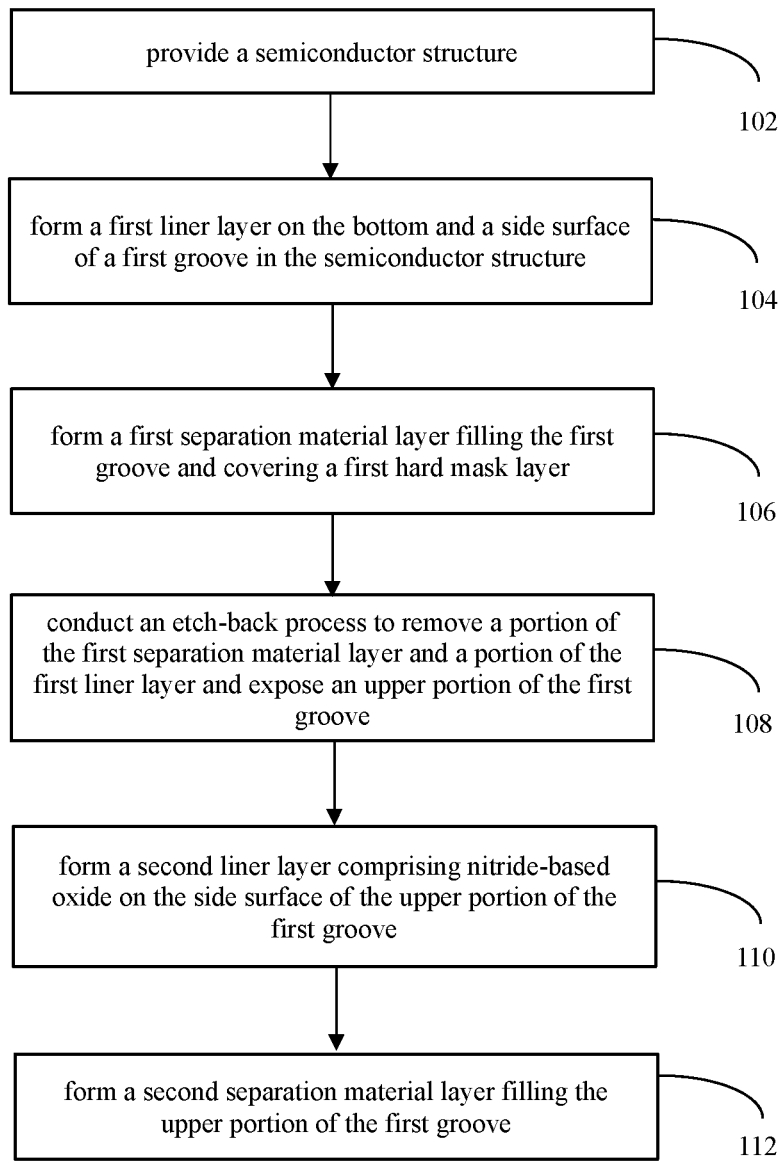
FIG. 1 shows a simplified flowchart illustrating a semiconductor device manufacturing method in accordance with one embodiment of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a simplified flowchart illustrating a semiconductor device manufacturing method in accordance with one embodiment of this inventive concept. FIGS. 2A, 2B, 2C, 2D, 2E, 2F, and 2G show schematic sectional views illustrating different stages of a semiconductor device manufacturing method in accordance with one or more embodiments of this inventive concept. This semiconductor device manufacturing method is described below with reference to these drawings.

Referring to FIG. 1, in step 102, a substrate structure is provided.

Figure 2A:
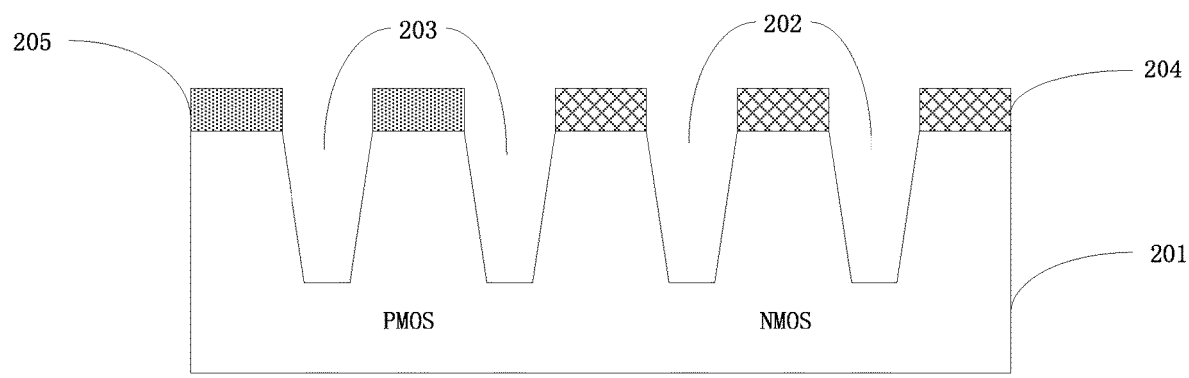
FIGS. 2A, 2B, 2C, 2D, 2E, 2F, and 2G show schematic sectional views illustrating different stages of a semiconductor device manufacturing method in accordance with one or more embodiments of this inventive concept.

Referring to FIG. 2A, the substrate structure comprises a substrate 201, which comprises an NMOS region that has a first groove 202. The substrate structure may further comprise a first hard mask layer 204 on the NMOS region outside the first groove 202.

In one embodiment, the substrate 201 may further comprise a PMOS region that has a second groove 203. The substrate structure may further comprise a second hard mask layer 205 on the PMOS region outside the second groove 203.

For example, the substrate 201 may be a silicon substrate or other semiconductor substrate, the first hard mask layer 204 and the second hard mask layer 205 may be made of silicon-based nitride.

It should be understood that the NMOS region and the PMOS region are the regions where, after a separation structure is formed, an NMOS device and a PMOS device will be respectively formed. In one embodiment, the NMOS region may comprise a P-type trap, and the PMOS region may comprise an N-trap trap. In one embodiment, after the P-type trap and N-type trap have been formed, patterned first hard mask layer 204 and patterned second hard mask layer 205 may be formed on the substrate 201, then the first groove 202 and the second groove 203 may be formed by etching the substrate 201 with respect to the first hard mask layer 204 and the second hard mask layer 205.

Figure 2B:
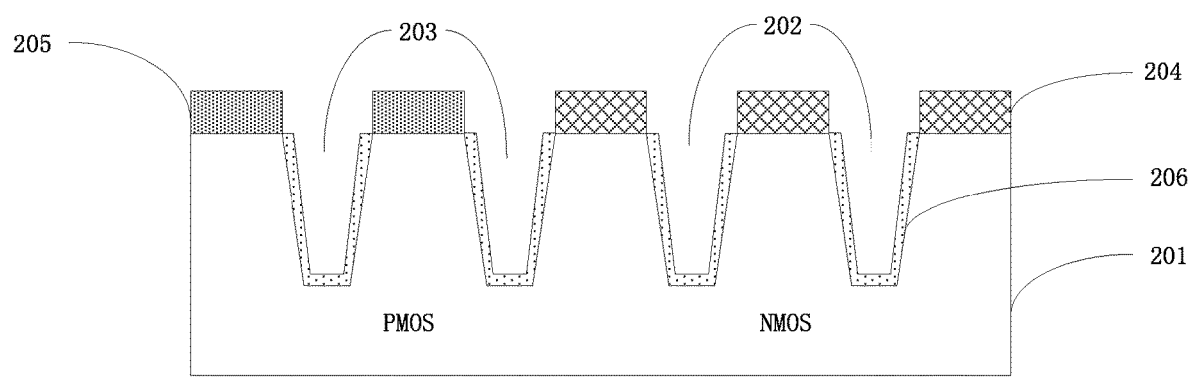

Next, referring to FIG. 2B, in step 104, a first liner layer 206 is formed on the bottom and a side surface of the first groove 202. When the substrate structure comprises a second groove 203, the first liner layer 206 may also be formed on the bottom and a side surface of the second groove 203.

For example, the first liner layer 206 may be formed through a thermal growth process such as an In-Situ Stream Generation (ISSG) process. In one embodiment, the first liner layer 206 may be made of silicon-based oxide such as silicon dioxide. The first liner layer 206 helps to repair the damage the substrate 201 sustained when it was etched to form the first groove 202 and the second groove 203, it also facilitates, in a succeeding stage, the bonding between the substrate 201 and a filling material in the first groove 202 and the second groove 203.

Figure 2C:
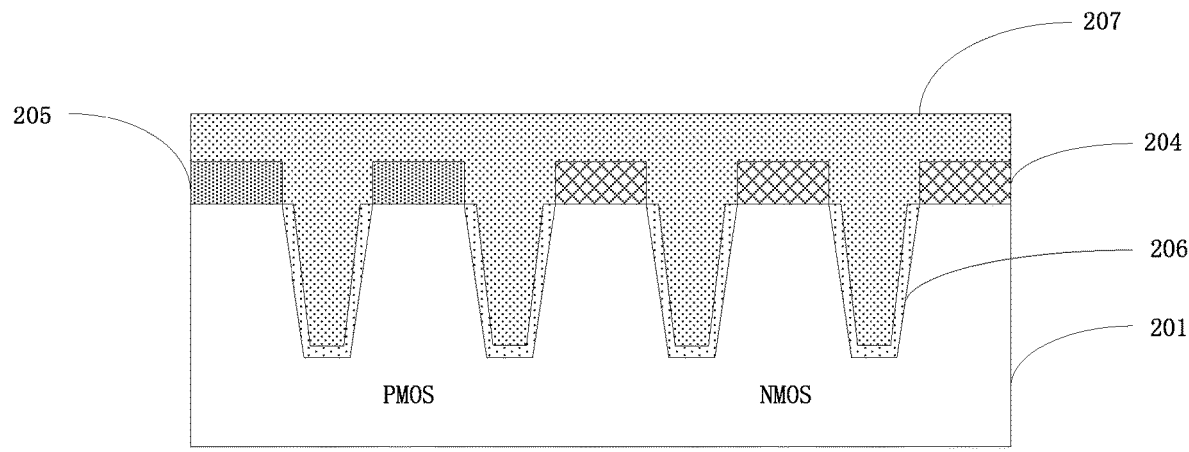

Next, referring to FIG. 2C, in step 106, a first separation material layer 207 is formed filling the first groove 202 and covering the first hard mask layer 204. When the substrate structure comprises the second groove 203, the first separation material layer 207 may also fill the second groove 203 and cover the second hard mask layer 205.

In one embodiment, the first separation material layer 207, which may comprise a dielectric material such as silicon-based oxide, may first be deposited on the structure of FIG. 2B, then a planarization process may be conducted on the first separation material layer 207.

Figure 2D:
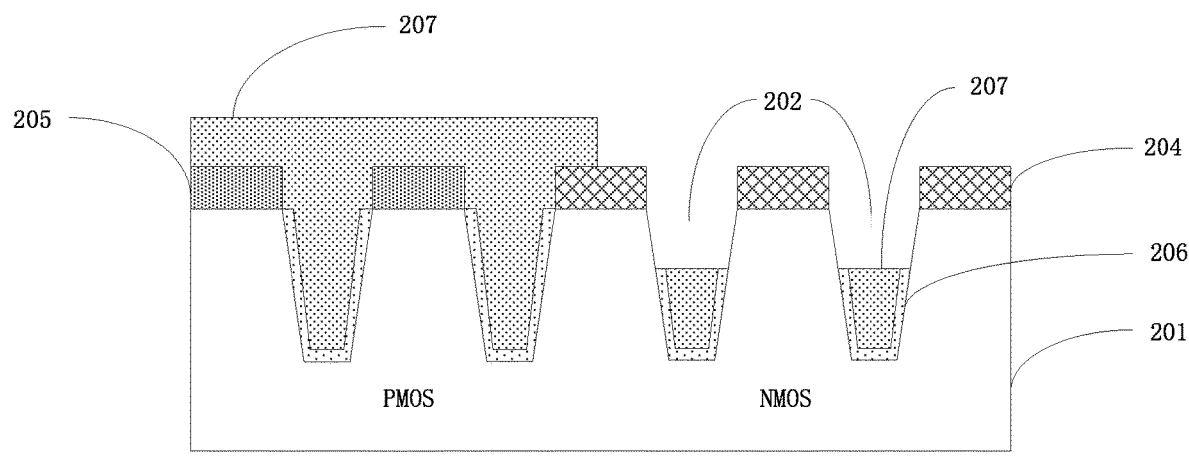

Next, referring to FIG. 2D, in step 108, an etch-back process is conducted to remove a portion of the first separation material layer 207 and a portion of the first liner layer 206 to expose an upper portion of the first groove 202. In one embodiment, the portion of the first separation material layer 207 removed in the etch-back process may have a thickness in a range of 10 angstrom to 2000 angstrom (e.g., 100 angstrom, 500 angstrom, 1000 angstrom, or 1500 angstrom).

In one embodiment, an auxiliary hard mask layer (which may be a photoresist) may first be formed on the PMOS region, then, using the auxiliary hard mask as a mask, a portion of the the first separation material layer 207 and a portion of the first liner layer 206 on the NMOS region may be removed to expose the upper portion of the first groove 202. After that, the auxiliary hard mask layer will be removed.

It should be understood that, in this disclosure, the "upper portion" of the first groove 202 is a relative concept, that is, any portion on top of the first groove 202 may be considered its "upper portion," with the portion below it a "lower portion."

Figure 2E:
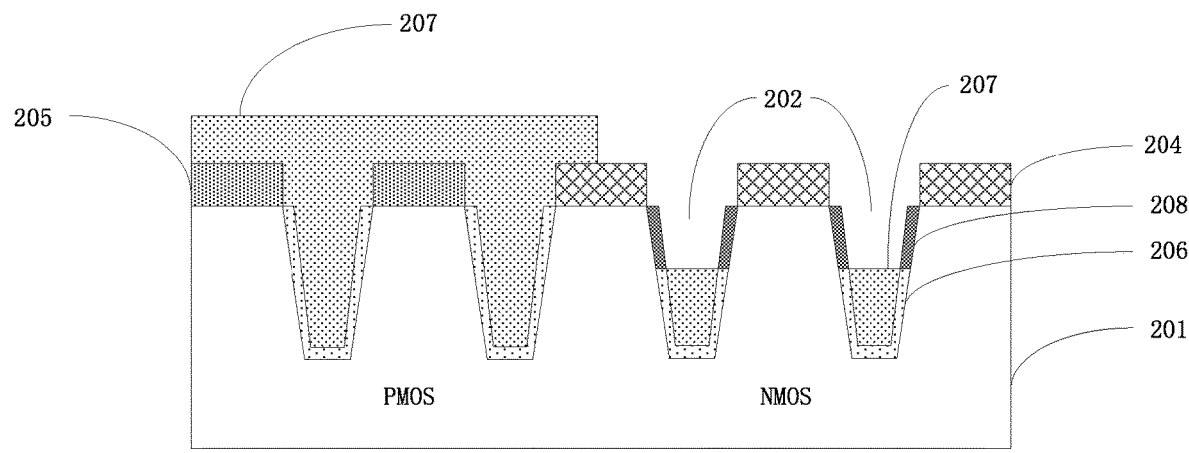

Next, referring to FIG. 2E, in step 110, a second liner layer 208 comprising nitrite-based oxide may be formed on a side surface of the upper portion of the first groove 202. In one embodiment, the second linear layer 208 may comprise $SiO_xN_y$, wherein x and y are positive integers (e.g., SiON), and the thickness of the second linear layer 208 may be in a range of 10 angstrom to 100 angstrom (e.g., 30 angstrom, 50 angstrom, or 80 angstrom).

The second linear layer 208 may be formed by a Rapid Thermal Annealing (RTA) process, or alternatively, a Rapid Thermal Oxidation (RTO) and a Rapid Thermal Nitriding (RTN) process for reduced compressive stress. The second liner layer 208 may also be formed through a deposition process such as Atomic Layer Deposition (ALD) or Chemical Vapor Deposition (CVD). In one embodiment, a source gas for forming the second liner layer 208 may include, but not limit to, NO, $N_2O$ or $NH_3$. In one embodiment, to achieve a lowest possible compressive stress, nitrogen concentration in the source gas for forming the second liner layer 208 may be in a range of $1 \times 10^{14}$ to $1 \times 10^{16}$ atoms/cm$^3$ (e.g., $2 \times 10^{14}$, $5 \times 10^{14}$, $1 \times 10^{15}$, or $5 \times 10^{15}$ atoms/cm$^3$).

Figure 2F:
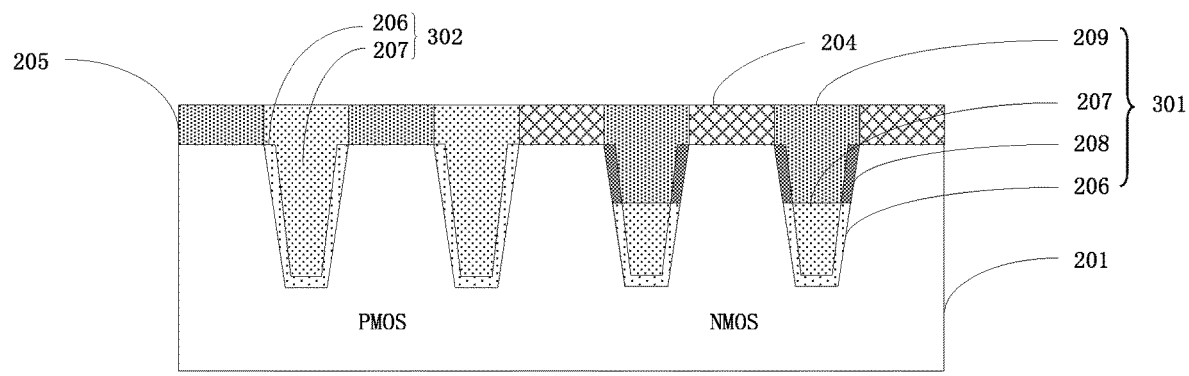

For example, silicon dioxide formed through an ISSG process may have a compressive stress of −408.7 Mpa, while nitrite-based oxide formed through a RTO and a RTN process with similar thickness only has a compressive stress of −222.9 Mpa. Compare with conventional silicon-base oxide layer, a nitrite-based oxide layer has substantially less compressive stress, which results in better performance (e.g., faster response time, larger drain current) of a resulted NMOS device Next, referring to FIG. 2F, in step 112, a second separation material layer 209 is formed filling the upper portion of the first groove 202, and a first separation structure 301 is thus formed. When the substrate structure further comprises the second groove 203, a second separation structure 302, as shown in FIG. 2F, may also be formed.

The first separation structure 301 may comprise the first liner layer 206 on the bottom of the first groove 202 and a side surface of the lower portion of the first groove 202, the first separation material layer 207 on the first liner layer 206 filling the lower portion of the first groove 202, the second liner layer 208 on the side surface of the upper portion of the first groove 202, and the second separation material layer 209 on the first separation material layer 206 and the second liner layer 208 filling the upper portion of the first groove 202. An upper surface of the the second separation material layer 209 in the first separation structure 301 may be higher than an upper surface of the NMOS region. In one embodiment, upper surfaces of the second separation material layer 209 and the first hard mask layer 204 may be substantially at the same horizontal level. In this disclosure, two surfaces are considered "substantially" in the same horizontal level as long as their horizontal positions are within a normal process deviation.

The second separation structure 302 may comprise the first liner layer 206 on the bottom and a side surface of the second groove 203, and the first separation material layer 207 on the first liner layer 206 filling the second groove 203. An upper surface of the first separation material layer 207 in the second separation structure 302 may be higher than an upper surface of the PMOS region. In one embodiment, upper surfaces of the first separation material layer 207 in the second separation structure 302 and the second hard mask layer 205 may be substantially at the same horizontal level.

In one embodiment, the second separation material layer 209 may first be deposited on the structure of FIG. 2E, then a planarization process may be conducted on the second separation material layer 209 and the first separation material layer 207 to form the first separation structure 301 and the second separation structure 302.

Figure 2G:
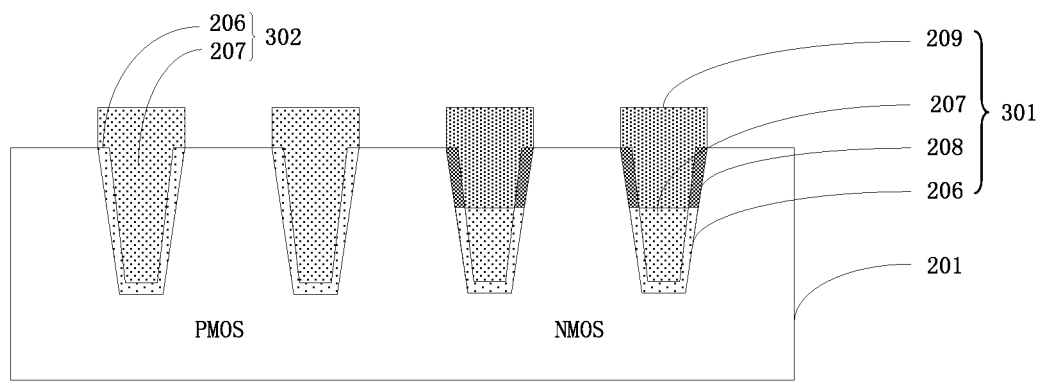

Next, referring to FIG. 2G, the first hard mask layer 204 and the second hard mask layer 205 may be removed. After that, standard CMOS manufacturing processes may be conducted to form, for example, an NMOS device in the NMOS region and a PMOS device in the PMOS region.

The manufacturing method described above forms a new separation structure—the first separation structure (and the second separation structure, if the substrate structure comprises a second groove). Liner layers in the first separation structure comprise a first liner layer in the bottom of the groove and a second liner layer comprising nitrite-based oxide on the top of the groove. Since the second liner layer comprises nitrite-based oxide, it has a smaller compressive stress than that of the first liner layer (which comprises silicon-based oxide), therefore compared to the liner layer in conventional semiconductor manufacturing methods, this two-layer configuration improves the performance of the device (e.g., an NMOS device) in the NMOS region.

This inventive concept further presents a semiconductor device, which may be manufactured by the manufacturing method described above or other manufacturing methods.

Referring to FIG. 2G, in one embodiment, the semiconductor device may comprise:
a substrate 201, comprising an NMOS region that has a first groove 202 (FIG. 2E); and
a first separation structure 301.

The detail composition of the first separation structure 301 is the same as that described in the manufacturing method above, and therefore is omitted here for conciseness.

Referring to FIG. 2G, in one embodiment, the substrate 201 may further comprise a PMOS region that has a second groove 203 (FIG. 2B), and the semiconductor device may further comprise a second separation structure 302. The detail composition of the second separation structure 302 is the same as that described in the manufacturing method above, and therefore is omitted here for conciseness.

Referring to FIG. 2F, in one embodiment, the semiconductor device may further comprise a first hard mask layer 204 on the NMOS region outside the first groove 202. In one embodiment, upper surfaces of the second separation material layer 209 and the first hard mask layer 204 may be substantially at the same horizontal level.

Referring to FIG. 2F, in one embodiment, the semiconductor device may further comprise a second hard mask layer 205 on the PMOS region outside the second groove 203.

This concludes the description of a semiconductor device and its manufacturing method in accordance with one or more embodiments of this inventive concept. For purposes of conciseness and convenience, some components or procedures that are well known to one of ordinary skills in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device, comprising:
a substrate, comprising an N-type Metal Oxide Semiconductor (NMOS) region that has a first groove; and
a first separation structure, comprising:
a first liner layer set including a first liner layer, directly contacting the bottom of the first groove and a pair of side surfaces of a lower portion of the first groove, and having two first liner contact faces;
a first separation material layer directly contacting the first liner layer, filling the lower portion of the first groove, and having a first separation material contact face;
a second liner layer set including a second liner layer, directly contacting a pair of side surfaces of an upper portion of the first groove, and having two second liner contact faces; and
a second separation material layer directly contacting the first separation material layer and the second liner layer, filling the upper portion of the first groove, and having a second separation material contact face,
wherein the two first liner contact faces respectively directly contact the two second liner contact faces,
wherein the first separation material contact face directly contacts the second separation material contact face, and
wherein a sum of widths of the first liner contact faces and the first separation material contact face is equal to a sum of widths of the second liner contact faces and the second separation material contact face.

2. A semiconductor device, comprising:
a substrate, comprising an N-type Metal Oxide Semiconductor (NMOS) region that has a first groove; and
a first separation structure, comprising:
a first liner layer on the bottom of the first groove and a side surface of a lower portion of the first groove;
a first separation material layer on the first liner layer filling the lower portion of the first groove;

a second liner layer on a side surface of an upper portion of the first groove; and a second separation material layer on the first separation material layer and the second liner layer filling the upper portion of the first groove, wherein the second liner layer comprises $SiO_xN_y$, wherein x and y are positive integers.

3. The semiconductor device of claim 2, wherein the second liner layer comprises SiON.

4. The semiconductor device of claim 1, wherein the first liner layer comprises silicon-based oxide.

5. The semiconductor device of claim 1, wherein the thickness of the second liner layer is in a range of 10 angstroms to 100 angstroms.

6. The semiconductor device of claim 1, wherein the substrate further comprises a P-type Metal Oxide Semiconductor (PMOS) region that has a second groove, and wherein the semiconductor device of claim 1 further comprising:

a second separation structure, comprising:
the first liner layer on the bottom and a side surface of the second groove; and
the first separation material layer on the first liner layer filling the second groove.

7. The semiconductor device of claim 1, further comprising:

a first hard mask layer on the NMOS region outside the first groove.

8. The semiconductor device of claim 7, wherein upper surfaces of the second separation material layer and the first hard mask layer are substantially at the same horizontal level.

9. A semiconductor manufacturing method, comprising:
providing a substrate structure, comprising:
a substrate comprising an NMOS region that has a first groove; and
a first hard mask layer on the NMOS region outside the first groove;
forming a first liner layer on the bottom and a side surface of the first groove;
forming a first separation material layer filling the first groove and covering the first hard mask layer;
conducting an etch-back process to remove a portion of the first separation material layer and a portion of the first liner layer to expose an upper portion of the first groove;
forming a second liner layer comprising nitrite-based oxide on a side surface of the upper portion of the first groove; and
forming a second separation material layer filling the upper portion of the first groove.

* * * * *